United States Patent
Banin et al.

(10) Patent No.: US 7,200,318 B2
(45) Date of Patent: Apr. 3, 2007

(54) NEAR INFRA-RED COMPOSITE POLYMER-NANOCRYSTAL MATERIALS AND ELECTRO-OPTICAL DEVICES PRODUCED THEREFROM

(75) Inventors: Uri Banin, Mevasseret Zion (IL); Nir Tessler, Zichron Yaakov (IL)

(73) Assignees: Yissum Research Development Company of the Hebrew University of Jerusalem, Jerusalem (IL); Technion R & D Foundation Ltd., Haifa (IL)

( * ) Notice: Subject to any disclaimer, the term of this patent is extended or adjusted under 35 U.S.C. 154(b) by 0 days.

(21) Appl. No.: 10/837,095

(22) Filed: Apr. 29, 2004

(65) Prior Publication Data

US 2005/0002635 A1    Jan. 6, 2005

Related U.S. Application Data

(63) Continuation-in-part of application No. PCT/IL02/00867, filed on Oct. 29, 2002.

(30) Foreign Application Priority Data

Oct. 29, 2001    (IL) ..................................... 146226

(51) Int. Cl.
*H01S 5/00*      (2006.01)
*H01L 21/00*     (2006.01)
*H01L 29/18*     (2006.01)
*H01L 31/12*     (2006.01)
*G02B 6/00*      (2006.01)

(52) U.S. Cl. ..................... 385/147; 385/141; 438/29; 372/38.05; 372/43.01; 372/44.011; 257/42; 257/79

(58) Field of Classification Search ............. 438/29; 385/147; 372/38.05, 43.01; 257/42, 79
See application file for complete search history.

(56) References Cited

U.S. PATENT DOCUMENTS 6,049,090 A * 4/2000 Clark, Jr. ..................... 257/13

(Continued)

FOREIGN PATENT DOCUMENTS

WO    WO 02/25745    3/2002

OTHER PUBLICATIONS

Yong-Chun et al. "Study of Luminescence of Organic Thin Films Using Field Emitter Arrays." Proceedings of the 5th Asian Symposium. Mar. 17-19. pp. 19-23.*

(Continued)

*Primary Examiner*—Michelle Connelly-Cushwa
*Assistant Examiner*—Rhonda S. Peace
(74) *Attorney, Agent, or Firm*—Frommer Lawrence & Haug LLP; William S. Frommer (57) ABSTRACT

The invention comprises a composite material comprising a host material in which are incorporated semiconductor nanocrystals. The host material is light-transmissive and/or light-emissive and is electrical chargetransporting thus permitting electrical charge transport to the core of the nanocrystals. The semiconductor nanocrystals emit and/or absorb light in the near infrared spectral range. The nanocrystals cause the composite material to emit/absorb energy in the near infrared (NIR) spectral range, and/or to have a modified dielectric constant, compared to the host material. The invention further comprises electro-optical devices composed of this composite material and a method of producing them. Specifically described are light emitting diodes that emit light in the NIR and photodetectors that absorb light in the same region.

42 Claims, 9 Drawing Sheets

U.S. PATENT DOCUMENTS

| | | | |
|---|---|---|---|
| 6,239,355 B1* | 5/2001 | Salafsky | 136/250 |
| 6,306,610 B1* | 10/2001 | Bawendi et al. | 435/7.1 |
| 6,319,426 B1* | 11/2001 | Bawendi et al. | 252/301.4 R |
| 6,456,423 B1* | 9/2002 | Nayfeh et al. | 359/328 |
| 6,501,091 B1* | 12/2002 | Bawendi et al. | 257/14 |
| 6,872,403 B2* | 3/2005 | Liu et al. | 428/403 |
| 6,872,471 B2* | 3/2005 | Epstein et al. | 428/690 |
| 6,961,499 B2* | 11/2005 | Lee et al. | 385/122 |
| 2002/0071948 A1* | 6/2002 | Duff et al. | 428/323 |
| 2004/0023010 A1* | 2/2004 | Bulovic et al. | 428/209 |
| 2005/0020923 A1* | 1/2005 | Frangioni et al. | 600/473 |
| 2005/0192430 A1* | 9/2005 | Rosenthal et al. | 530/391.3 |
| 2005/0236556 A1* | 10/2005 | Sargent et al. | 250/214.1 |
| 2006/0065943 A1* | 3/2006 | Hill | 257/442 |

OTHER PUBLICATIONS

Weck, Marcus. "Less Expensive Displays: New Technique Allows Polymer Processing of a Key Soild-State Fluorescent Material." Georgia Institute of Technology Reseach News. Mar. 27, 2003.*

Friend R.H. "Conjugated Polymers: New Materials for Optoelectronic Devices." Pure Applied Chemistry, vol. 73, No. 3, pp. 425-430, 2001.*

A- Dodahalapm; Z. Buo, A. Makhila, J. Lagmndanum, V. Raja, Y. Feng, H. Katz and J. Rogers, "Organic smart pixels", Appl. Phys. Lett., vol. 73, pp. 142-144, 1998.

Y. Cao, I.D. Parker, G. Yu, C. Zhun, A.J. Heeger, "Improved quantum efficiency for electroluminescence in semiconducting polymers", Nature, vol. 397, pp. 414-417,1999.

P.K.H. Ho, D.S. Thomas, R.H. Friend, N. Tessler, "All-polymer optoelectronic devices", Science, vol. 285, pp. 233-236, 1999.

Y.W. Cao and U. Banin, "Growth and Properties of Semiconductor Core/Shell Nanocrystals with InAs Cores" J. Am. Chem. Soc, vol. 122, pp. 9692-9702, 2000.

R.J. Curry, W. P. Gillin,"1.54 mm electroluminescence from erbium (III) Tris-8-hydroxyquinoline (ErQ) based organic light-emitting diodes", Appl. Phys. Lett., vol. 75, pp. 1380-1382, 1999.

L. Slooff, A. Polman, F. Cacialli, R. Friend, G. Hebbink, F. van Veggel, D. Reinhoudt, "Near-infrared electroluminescence of polymer light-emitting diodes doped with a lissamine-sensitized Nd3+ complex", Appl Phys. Lett., vol. 78, pp. 2122-2124,2001.

Y. Kawamura, Y. Wada, M. Iwamuro, T. Ktamura, S. Yanagida, "Near-infrared electrolu anescence from ytterbium(iii) complex", Chem. Lett., pp. 280-281, 2000.

L.H. Slooff, A. Polman, M.P. Oude Wolbers, F.C.J.M. van Veggel, D.N. Reinhoudt, J.W. Hofstraat, "Optical properties of erbium-doped organic polydentate cage complexes", J. Appl. Phys., vol. 83, pp. 497-503, 1998.

M.A. Baldo, M.E. Thompson, S.R. Forrest, "High-efficiency fluorescent organic light-emitting devices using a phosphorescent sensitizer", Nature, vol. 403, pp. 750-753, 2000.

P.K.H. Ho, J.S. Kim, J.H. Burroughes, H. Becker, S.F.Y. Li, T.M. Brown, F. Cacialli, R.H. Friend, Molecular-scale interface engineering for polymer light-emitting diodes, Nature, vol. 404, pp. 481-484,2000.

V.L. Colvin, M.C. Schlamp, A.P. Alivisatos, "Light-Emitting Diodes Made from Cadmium Sclenide Nanocrystals and a Semiconducting Polymer", Nature, vol. 370, pp. 354-357, 1994.

B.O. Dabbousi, M.G. Bawendi, O. Onitsuka, M.F. Rubner, "Electroluminescence from CdSe Quantum-Dot Polymer Composites", Appl. Phys. Lett., vol. 66, pp. 1316-1318,1995.

M.C. Schlamp, X..G. Peng, A.P. Alivisatos, "Improved efficiencies in light emitting diodes made with CdSe(CdS) core/shell type nanocrystals and a semiconducting polymer" J. Appl. Phys., vol. 82, pp. 5837-5842,1997.

H. Mattoussi, L. H. Radzilowski, "Electrolummcscence from m heterostructures of poly(phenylene vinylene) and inorganic CdSe nanocrystals", J. Appl. Phys., vol. 83, pp. 7965-7974, 1998.

A. Mews, A. Eychmuller, M. Giersig, D. Schooss, H. Weller, "Preparation, Characterization and Photophysics of the Quantum-Dot Quantum-Well System CdS/HgS/CdS", J. Phys. Chem., vol. 98, pp. 934-941, 1994.

X.G. Peng, MC. Schlamp, A.V. Kadavanich, A.P. Alivisatos, "Epitaxial growth of highly luminescent CdSe/CdS core/shell nanocrvstals with photostability and electronic accessibility", J. Am. Chem. Soc., vol. 119, pp. 7019-7029, 1997.

B.O. Dabbousi, J. RodriguezViejo, F.V. Mikulec, J.R. Heine, H. Mattoussi, R. Ober, K.F. Jensen, M.G. Bawendi, "(CdSe)ZnS core-shell quantum dots: Synthesis and characterization of a size series of highly luminescent nanocrystallites", J. Phys. Chem. B., vol. 101, pp. 9463-9475, 1997.

S.V. Kershaw, M. Burt, M. Harrison, A. Rogach, H. Weller, A. Eychmuller, "Colloidal CdTe/HgTe quantum dots with high photoluminescence quantum efficiency at room temperature", Appl. Phys. Lett., vol. 75, pp. 1694-1696,1999.

M.T. Harrison, S. V. Kershaw, A. L. Rogach, A. Kornowski, A. Eychmuller, H. Weller, "Wet chemical synthesis highly luminescent HgTe/CdS core/shell nanocrystals", Adv. Mtn., vol. 12, pp. 123-125, 2000.

Y.W. Cao and U. Banin, Synthesis and Characterization of InAs/InP and InAs/CdSe Cote/Shell Nanocrvstals, Angew. Chem. Int. Ed. Engl., vol. 38, pp. 3692-3694,1999.

V. Cleave, C. Yahioglu, P. LeBarny, R.H. Friend, N. Tessler, "Harvesting single and triplet energy in polymer LEDs", Advanced Materials, vol. 11., pp. 285-298,1999.

ADSDYES, http://www.adsdyes.com/, American Dye Sour ce Inc.

A.A. Guzelian, U. Banin, A. V. Kadavanich, X. Peng, A. P. Alivisatos, "Colloidal chemical synthesis and characterization of InAs nanocrystal quantum dots", Appl. Phys. Lett., vol. 69, pp. 1432-1434,1996.

X.G. Peng, J. Wickham, A.P. Alivisatos, "Kinetics of II-VI and III-V colloidal semiconductor nanocrystal growth: "Focusing" of size distributions", J. Am. Chem. Soc., vol. 120, pp. 5343-5344, 1998.

N. Tessler, "Transport and optical modeling of organic light-emitting diodes", Appl. Phys. Lett., vol. 77, pp. 1897-1899, 2000.

N.C. Greenham, X.G. Peng, A. P. Alivisatos, "Charge separation and transport in conjugated-polym/semiconductor-nanocrystal composites studied by photoluminescence quenching and photoconductivity" Phys. Rev. B—Cond. Matt., vol. 54, pp. 17628-17637, 1996.

Mattoussi, H. et al: "Composite thin films . . . electroluminescence", Journal of Applied Physics, Oct. 15, 1999, vol. 86, No. 8, pp. 4390-4399, XP002237381.

Millo, O. et al: Tunneling and optical._dots Physica Status Soldli. B, Basic Research, (DL), vol. 224, No. 1, 2001, pp. 271-276, XP002198576.

Appl. Phys. Rev.: Slooff, et al., J. Appl. Phys., vol. 91, No. 7, pp. 3955-3980 (Apr. 1, 2002).

* cited by examiner

NEAR INFRA-RED COMPOSITE POLYMER-NANOCRYSTAL MATERIALS AND ELECTRO-OPTICAL DEVICES PRODUCED THEREFROM

RELATED APPLICATIONS

This is a continuation-in-part of copending international application PCT/IL02/00867 having an international filing date of 29 Oct. 2002.

FIELD OF THE INVENTION

The present invention relates to the fields of molecular electronics and optoelectronics. More specifically, the invention relates to composite materials consisting of a suitable host material into which are incorporated, by blending, mixing, or any other suitable means semiconductor nanocrystals such that the composite material has a dielectric constant different than that of the host material and/or emits/absorbs energy in the near infrared (NIR) spectral range and to electro-optical devices composed of this composite material.

BACKGROUND OF THE INVENTION

Publications and other reference materials referred to herein, including references cited therein, are incorporated herein by reference in their entirety and are numerically referenced in the following text and respectively grouped in the appended Bibliography, which immediately precedes the claims.

Molecular electronics and optoelectronics [1–4] have been gaining prominence over the past few years. Development in these fields has been restricted, however, since organic molecules are commonly optically active only at wavelengths shorter than 1 μm. Previous attempts to achieve 'plastic' based light emitting devices beyond 1 μm involve the incorporation of lanthanide complexes. In these complexes, a rare-earth atom is placed within an organic molecule [5, 6, 7]. The most obvious choice is that of the Erbium atom, which is the common amplifying medium employed in the 1.5 μm telecommunication range.

To date, such attempts have suffered from absorption bands (associated with the vibrations of the organic-molecule or polymer) that deactivate any lanthanide atom that has been tried. Methods that attempt to shield the lanthanide have been developed [8], but there still remains much room for improving the obtained results in terms of: intensity, efficiency, wavelength coverage, and spectral bandwidth. For example, the reports of the results of the work done with the lanthanide complexes show extremely small efficiency and wavelength coverage as dictated by the discrete lanthanides atomic lines.

The inherent and proven qualities of organic light-emitting molecules and polymers in the visible range [2, 9, 101 are the driving force behind the quest for extending the plastic technology to the near infrared (NIR), where the telecommunication bands are located around 1.3 μm and around 1.5 μm.

Nanocomposite devices in which core/shell nanocrystals are incorporated within a conducting polymer have been previously demonstrated for the visible range [11–14], but have not yet been reported for the NIR.

The use of core/shell [11–19] semiconducting nanocrystals and, in particular those with strong emission in the NIR [4, 201, is well known. Co-pending International Patent Application WO 02/25745, the description of which is incorporated herein by reference, describes in detail NIR emitting core/shell nanocrystals.

It is therefore, a purpose of this invention to provide composite materials consisting of a host material in which are incorporated semiconductor nanocrystals such that the composite material efficiently emits/absorbs energy or changes its dielectric constant in the near infrared spectral range.

It is a further object of this invention to provide composite materials that efficiently emit/absorb energy or change their dielectric constant in the near infrared spectral range and can thus be used in the manufacture of electrooptical devices.

It is a further a purpose of this invention to provide electro-optical devices composed of semiconductor nanocrystals which emit/absorb energy in the NIR, mixed with or blended into a conducting or semiconducting polymer.

It is yet a further purpose of this invention to provide a method of producing electro-optical devices including light emitting diodes composed of core/shell nanocrystals incorporated within a conducting or semi-conducting polymer that efficiently emit energy in the near infra red.

It is another purpose of this invention to provide a method of applying voltage or current to a composite material composed of core/shell nanocrystals mixed with or blended into a conducting or semi-conducting polymer to construct lightdetectors or light modulators.

It is yet another purpose of this invention to provide a method of designing the nano-crystal structure so as to optimize its incorporation into the polymeric materials.

Further purposes and advantages of this invention will appear as the description proceeds.

SUMMARY OF THE INVENTION

In a first aspect, the invention provides a composite material comprising a host material in which are incorporated semiconductor nanocrystals. The nanocrystals emit/absorb energy in the near infra red (NIR) spectral range and the host material is light-transmissive and/or light-emissive and is electrical charge-transporting such as to permit electrical charge transport to or from the core of the nanocrystals. The composite material emits/absorbs energy in the near infrared spectral range and/or has a modified dielectric constant compared to the host material. In the composite materials of the invention, the host material contributes its property of electrical conductivity and the nanocrystals contribute their optical properties.

In the composite material of the invention, the semiconductor nanocrystals comprise a semiconductor nanocrystal core that emits/absorbs energy in the near infrared (NIR). In a preferred embodiment of the invention, at least one crystalline shell layer encapsulates the nanocrystal core. The semiconductor core/shell nanocrystals have a changed quantum yield and/or chemical stability and/or photostability that are different from those of the non-encapsulated nanocore. The nanocrystals can be coated with organic ligand on their outer surface. The ligand coating can be removed or substituted, depending on the application.

It should be noted that in this patent application the description generally discusses core/shell nanocrystals. However, some embodiments utilize a composite material that contains nanocrystal cores without a shell (nonencapsulated). In such cases the cores have some similar properties as those described for the core/shell nanocrystals, such as a similar absorption spectrum. Additionally, throughout this description, the terms core/shell nanocrystal, core/shell semiconductor, nanocrystals, and semiconductor nanocrystal are used interchangeably to refer to the nanocrystals employed in the composite materials of the invention.

The semiconductor core of the core/shell semiconductor consists of InAs, InSb, or can be a complex nanocrystalline core comprising a first cation species and a first anion species and at least one additional ionic species which can be cationic or anionic. The ratio of total cationic species to total anionic species is substantially equimolar. The cationic species is/are selected from In, Ga or Al and the anionic species is/are selected from As, Sb and P.

The core of the core/shell semiconductor can further comprise at least one additional species at dopant concentration. The additional species can be a rareearth element such as Er.

The shell of the composite material can comprise a first cationic species and a first anionic species at a substantially equimolar ratio. The first cationic species can be Zn or Cd and the first anionic species selected from sulphur, Se, or Te. The first cationic species can be Ga and the first anionic species selected from As and P.

The shell of the composite material can be a complex nanocrystalline shell that comprises a first cationic species and a first anionic species and at least one additional ionic species. The additional species can be cationic or anionic, the ratio of total cationic species to total anionic species being substantially equimolar. The additional cationic species are selected from Zn, Cd, Ga, Al and In and the additional anionic species are selected from sulphur, Se, As, and P.

The shell of the core/shell semiconductor can further comprise additional species at dopant concentrations. The additional species can be a rare-earth element such as Er.

In the preferred embodiment, the organic ligand on the outer surface of the nanocrystal incorporated in the composite material is selected from the group consisting of phosphines, amines, and thiols.

The host material of the composite material is light-transmissive (in the visible and NIR regions) and/or light-emissive (in the visible region) and is chargetransporting. The host material permits electrical charge transport to or from the core of said nanocrystals.

The host material of the composite material can be an organic material, which can be selected from the group consisting of polymers, conjugated polymers, oligomers, and materials composed of small organic molecules, these organic materials being electrically conductive. When the host material of the composite material is a polymer, it can be selected from the group consisting of:

poly(2-methoxy-5-(2'-ethyl)hexyloxyphenylene-vinylene)(MEH-PPV, commercially available as ADS-100RE);
a PPV-derivative (e.g. a di-alkoxy or di-alkyl derivative);
polyfluorene and/or a co-polymer incorporating polyfluorene segments;—PPVs and/or related co-polymers;
F6BT (ADS133);
PFOBT;
A side chain polymer such as PNP;
A doped polymer such as PEDOT or PANT; and
any other doped matrix such that the doping concentration is kept to the minimum required for efficient conduction in the presence of the nanocrystals.

An example of an organic material composed of small organic molecules of which the host material of the composite material can be composed is Alg3 (hydroxy quinoline aluminum).

The composite material of the invention has emission/absorption in the wavelength range of from about 0.8 microns to about 2 microns, and preferably from 1.1 microns to 1.6 microns.

In another aspect, the invention is directed towards providing electro-optical devices composed of a composite material consisting of a host material in which are incorporated semiconductor nanocrystals. The composite materials of which the electro-optical devices are composed emit/absorb energy in the near infrared spectral range and/or have a dielectric constant different than that of the host material. In the composite materials of the invention, the host material permits electrical charge transport to the core of the nanocrystals.

In particular, the invention is directed towards providing light-emitting diodes composed of core/shell nanocrystals mixed with or blended into a conducting or semi-conducting polymer such that the resulting composite material efficiently emits/absorbs energy in the near infra red or that, by using simple means (such as voltage, heat, etc.), it becomes possible to significantly influence other electrooptical properties such as the refractive index.

The invention is also directed toward providing a method of applying voltage or current to a composite material composed of nanocrystals mixed with or blended into a conducting or semi-conducting polymer to construct light-detectors or light modulators. By tuning the polymer and/or nanocrystal energy level position (typically done by modifying the attached chemical groups) it is possible to tune the composite from light emitting to energy absorbing as in photocells [26]. The introduction of absorption resonance in the NIR range makes it possible to significantly change the refractive index in its vicinity as in any semiconductor near its absorption resonance.

The electro-optical devices of the invention are chosen from the group composed of: light emitting diodes (LEDs), lasers, photovoltaic cells, photo-transistors, transistors, detectors, and modulators.

The properties of the semiconductor nanocrystals incorporated into the host material of which the electro-optical devices of the invention are composed are the same as the properties of the composite material that were summarized hereinabove and will be described in greater detail hereinbelow.

The electro-optical devices of the invention have emission or absorption onset in the wavelength range of from about 0.8 microns to about 2 microns, and preferably from 1.1 microns to 1.6 microns.

The composite material can be deposited onto an optical device so as to enhance its performance in the 0.8 to 2 micron range and preferably in the 1.1 to 1.6 micron range. Specifically, optical waveguides (made of glass, plastic, or polymer) can be coated with the nanocrystal (composite) to add optical functionality to the device. Such functionality includes, but is not limited to light amplification, detection, and attenuation.

In yet another aspect the invention provides a method of producing a light emitting diode, composed of a composite material consisting of a host material in which are incorporated semiconductor nanocrystals such that the composite material efficiently emits energy in the near infrared spectral range. The method consists of the following steps:
coating the substrate with a material;
annealing the coated substrate;
cooling the annealed substrate;
spin-coating a nano-composite solution on the surface of the coated substrate;

annealing the resulting structure; and
evaporating (or depositing) electrical contacts at the appropriate places on the resulting structure.

ITO-Glass is an example of a material suitable as the substrate on which the LED or photodetector is produced and PEDOT is an example of a material that can be used for coating the substrate. The nano-composite solution is spin-coated on the surface of the coated substrate to a resulting thickness of 50 nm to 150 nm, typically 100 nm. The top electrical contacts of the LED consist typically of electron ejecting materials chosen, for example, from the group: Ca, Al, K, Li, Na, and alloys of said materials.

In a further aspect the invention provides a method of producing a NIR photodetector. The method is similar to that employed for producing the LEDs.

All the above and other characteristics and advantages of the invention will be further understood through the following illustrative and non-limitative description of preferred embodiments thereof, with reference to the appended drawings.

DETAILED DESCRIPTION OF PREFERRED EMBODIMENTS

The invention will now be further explained through the illustrative and nonlimitative description of preferred embodiments.

This invention provides composite materials consisting of a suitable host material into which or on the surface of which are incorporated, by blending, mixing, layer by layer deposition, or any other suitable means semiconductor nanocrystals. The host material is light-transmissive and/or light-emissive and is electrical charge-transporting thus permitting electrical charge transport to the core of the nanocrystals. The nanocrystals cause the composite material to emit/absorb energy in the near infrared spectral range and/or have a modified dielectric constant, compared to the host material. Also provided are electrooptical devices composed of this efficient NIR guest-host nanocomposite emitter composite material.

In the material and devices of the invention, core/shell nanocrystals are incorporated within a conducting polymer. Core/shell [11–20] semiconducting nanocrystals with strong emission in the NIR [4, 20, and WO 02/257451 and possessing increased photostability are the basis for the method and devices of the invention. The properties such as light emission wavelength, photostability and electrical accessibility of the guest NIR active semiconductor nanocrystals are controlled by careful synthetic manipulation of the structure and dimensions. The core/shell nanocrystals used in the present invention are of particular relevance due to their strong NIR emission and increased photostability. Here, the physical properties are modified by controlling the core and shell composition and dimensions, as well as the type of the outer organic ligands.

The use of semiconducting polymers as the host material, or as an active conducting layer, for the composite material makes it possible to use either current or voltage excitation schemes so that electrically active devices (such as LEDs, lasers, photovoltaic cells, photo-transistors, transistors, detectors, and modulators) for NIR applications become feasible. Through control of the guest nanocrystal structure and dimensions (core, shell or composite shell, and outer organic ligand), the active region (core) of the nanocrystal is shielded from the absorption resonances of the host polymer, on one hand, but is not too isolated on the other. This means that the core can still absorb energy from the host through either charge transfer or neutral-excitation energy-transfer, as in the case of Forester or Dexter transfer mechanisms [9], and is sufficiently decoupled to avoid quenching of the fluorescence of the nanocrystals via interaction with the polymer host. The above feature is largely due to the transfer-in occurring at relatively high energy followed by relaxation within the nanocrystal structure into the shielded core.

The incorporation of the semiconductor nanocrystals extends the functionality of the polymer to the NIR, allowing for full tunability of the spectral range through the quantum confinement effect [WO 02/25745]. Using commercially available polymers [22], light emitting diodes are fabricated, using the method of the invention, that have typical external-efficiency values (photons-out divided by electrons-in) of −0.3%–1%, operating at a wavelength close to 1.3 μm.

The material functioning as the host or as a charge transferring layer for the nano-crystal facilitates electrical excitation and is preferably, but need not be, an organic material. Examples of suitable host materials are polymers, oligomers and materials of small organic molecules. The material must be suitably lighttransmissive and/or light-emissive and is charge-transporting. If the material is a polymer material it may be a conjugated polymer such as poly(p-phenylenevinylene) (PPV). Alternative polymers include; but are not limited to: —poly(2-methoxy-5-(2'-ethyl)hexyloxyphenylene-vinylene)(also denoted as MEH-PPV, commercially available as ADS-IOORE);

a PPV-derivative (e.g. a di-alkoxy or di-alkyl derivative);
polyfluorene and/or a co-polymer incorporating polyfluorene segments;—PPVs and/or related co-polymers;
F6BT (ADS 133);

PFOBT;

A side chain polymer such as PNP [21];

A doped polymer such as PEDOT or PANT; and any other doped matrix such that the doping concentration is kept to the minimum required for efficient conduction in the presence of the nanocrystals.

An example of an organic molecular material that can be used as a suitable host material is Alg3.

The nano-crystals can be made from group III–V or II–IV semiconductor cores and be based on the wide range of narrow band-gap materials as described in Reference [4]. The inorganic shell of the nano-crystal can be made of more than one layer so as to optimize strain considerations as well as suitable electronic resonances to couple to the host material. The outer organic ligand may take several forms, so as to optimize the shielding/coupling mechanisms. In some cases the outer organic-ligand is absent (or is removed or substituted), to allow for further optimization.

Figure 1A:
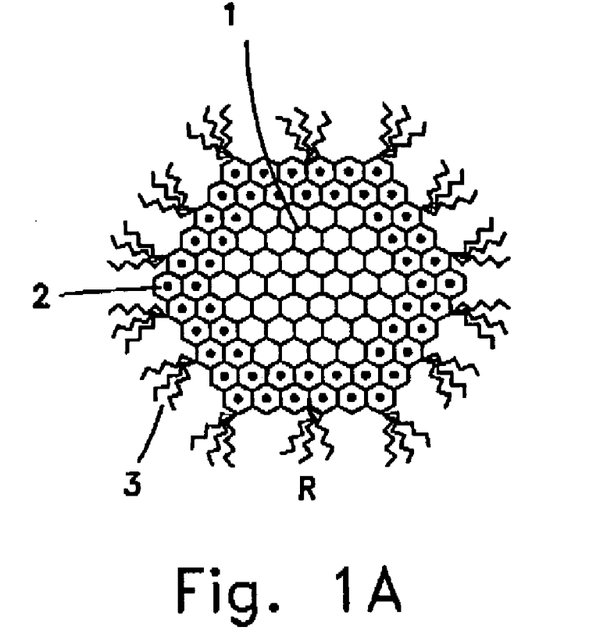
FIG. 1A schematically describes the typical structure of the nanocrystals used in the invention.
Figure 1B:
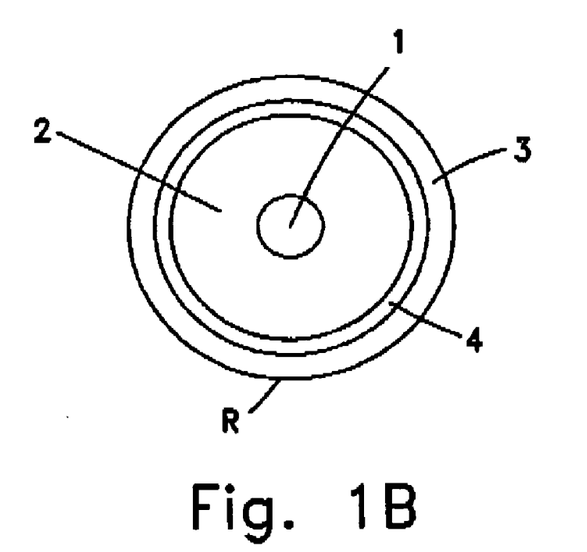
FIG. 1B shows the generalized structure of the nanocrystals.

FIG. 1A schematically describes the typical structure of the nanocrystals used in the invention. FIG. IB shows a generalized structure that could provide improved performance through careful optimization of both the chemical structure and size (from zero and up to a few nm) of each of the constituents of the nanocrystals. The use of multiple shell layers enables the design of high energy resonances (similar to high energy levels in a newly created quantum well) thus improving the energy/charge transfer from the host material into the nano-crystal active element i.e., the core.

In the Figures, the core of the nanoparticle is designated by numeral (1) and the shell by numeral (2). Numeral 3 and the letter R designate organic ligands that overcoat the outer surface of the nanocrystals. Numeral 4 designates the one or more optional additional shells that can be added to form the multi shell structure described above.

The semiconductor core/shell nanocrystals of the invention comprise a semiconductor nanocrystal core that emits/absorbs energy in the near infrared (NR), and have a crystalline shell encapsulating the core. The core/shell nanocrystal has a changed quantum yield and/or chemical stability and/or photostability that are different from those of an identical non-encapsulated nanocore. The core/shell nanocrystals are usually coated with organic ligands of various types such as phosphines, amines and thiols, on the outer surface. The ligands can be substituted or removed.

The semiconductor core/shell nanocrystals of the invention preferably have a semiconductor core consisting of InAs or InSb. However, the core can be a complex nanocrystalline core comprising a first cation species and a first anion species and at least one additional ionic species, which may be cationic or anionic. The ratio of total cationic species to total anionic species is substantially equimolar. The cationic species may be selected from In, Ga or Al and the anionic species is/are selected from As, Sb and P.

In the semiconductor core/shell nanocrystals of the invention the core may further comprise at least one additional species at dopant concentration. Such additional species may be a rare-earth element, for example a trivalent raree-arth element such as Er.

In the semiconductor core/shell nanocrystals of the invention the shell comprises a first cationic species and a first anionic species at a substantially equimolar ratio. The first cationic species may be Zn or Cd and the first anionic species may preferably be selected from sulphur, Se or Te. Alternatively, the first cationic species may be Ga and the first anionic species may be selected from As and P.

These semiconductor core/shell nanocrystals may have a shell that is a complex nanocrystalline shell that comprises a first cationic species and a first anionic species and at least one additional ionic species which may be cationic or anionic; the ratio of total cationic species to total anionic species being substantially equimolar. The additional cationic species may be selected from Zn, Cd, Ga, Al and In and the additional anionic species may be selected from sulphur, Se, As, and P. The shell of these semiconductor core/shell nanocrystals may further comprise additional species at dopant concentrations. The additional species may be a rare-earth element, particularly a trivalent rare-earth element such as Er.

In a typical example of the invention, nanoparticles having InAs cores with radius of 2.4 nm and ZnSe shells with nominal thickness of 1.5 monolayers, were prepared using a two step synthesis [4, 20]. In the first step cores were made using high temperature pyrolysis of organometallic precursors in a coordinating solvent trioctylphosphine (TOP), and were then separated from the growth solution [23, 24]. The size distribution of cores was improved using size-selective precipitation. In the second step the shells were grown using suitable precursors, in a mixture of trioctylphosphine (TOP), and trioctylphosphineoxide (TOPO). TOP and TOPO-coated core/shell nanocrystals were isolated from the growth solution. Such coated nanocrystals are schematically illustrated in FIG. 1A.

A more detailed account of suitable methods for preparing the core/shell nanocrystals, including those composed of materials other than InAs/ZnSe that are suitable for use in the composite polymer-nanocrystal LEDs of the invention, is presented in the above-mentioned WO 02/25745 and in Ref. 4.

Figure 2:
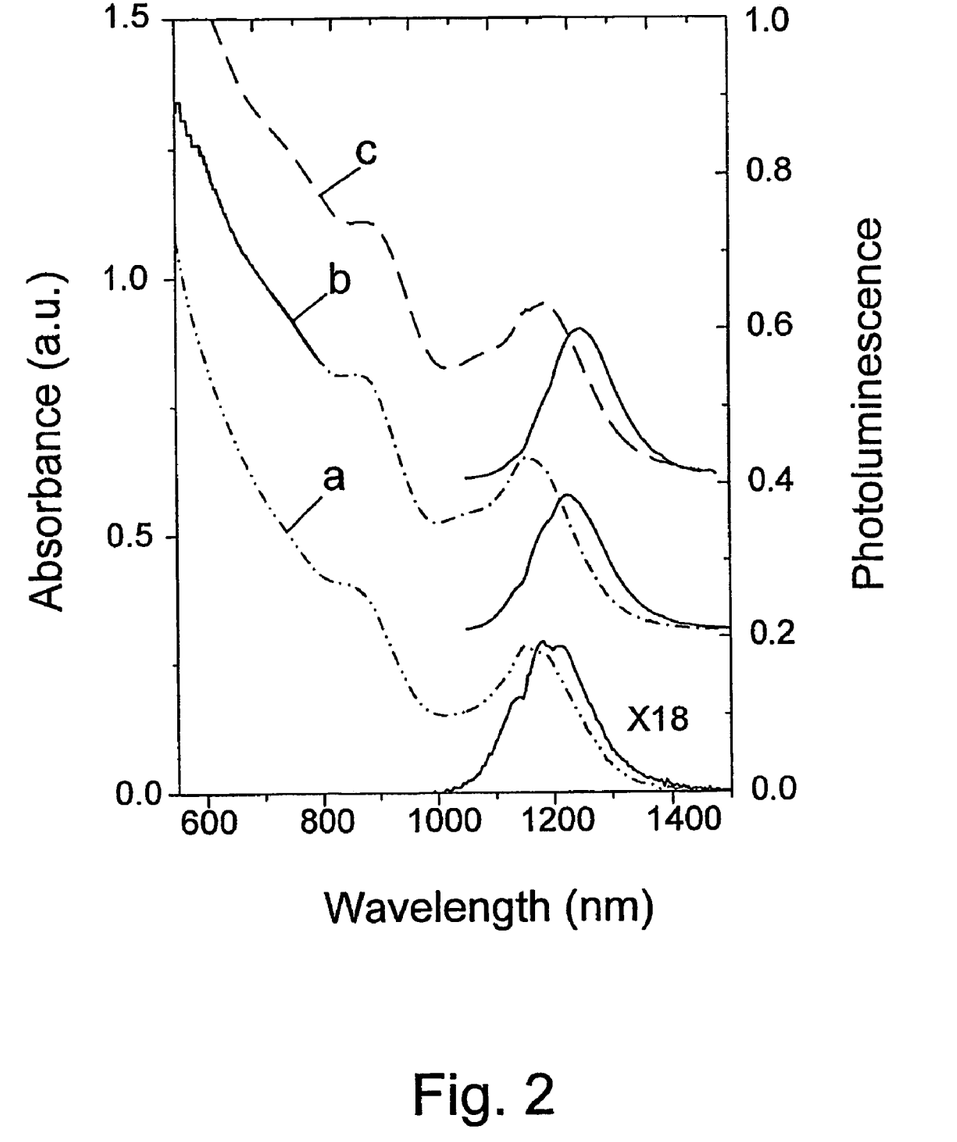
FIG. 2 shows the absorption and photoluminescence spectra of InAs cores and InAs/ZnSe core/shells.

The absorption and photoluminescence spectra of InAs cores, having diameter of 4.6 nm, (curve a) and InAs/ZnSe core/shells (curves b and c) used in the experiment are presented in FIG. 2. All samples are in toluene solution. Curves b and c represent results of two different preparations of shell growth on similar sized cores demonstrating the reproducibility of the core/shell synthesis.

For sample b, the photoluminescence peak is at 1250 nm, and the fluorescence quantum yield of the core/shells in solution reached a value of –20%. This represents an 18-fold increase compared with the original InAs core nanocrystals. The ability to obtain fluorescence in the wavelength band from about 0.8 microns to about 2 microns, and preferably from 1.1 microns to 1.6 microns, as well as to manipulate the fluorescence wavelength, through the choice of core/shell materials and dimensions is demonstrated elsewhere [4 and WO 02/25745].

Nano-composites of conjugated polymer (MEH-PPV or F6BT [22]) and core/shell nanocrystals were made by first creating separate solutions in toluene, one containing 5–10 mg/ml of the polymer and the second containing 40–100 mg/ml of the nano-particle. Appropriate volumes are then mixed to create the required weight ratio of 1:10 to 1:1, preferably 1:5, (polymer/nanocrystal). Films were spin cast from solution to about 100 nm thickness and the absorption spectra of the composite was measured using UV-VIS spectrometer as a final monitor of the composite ratio.

Figure 3A:
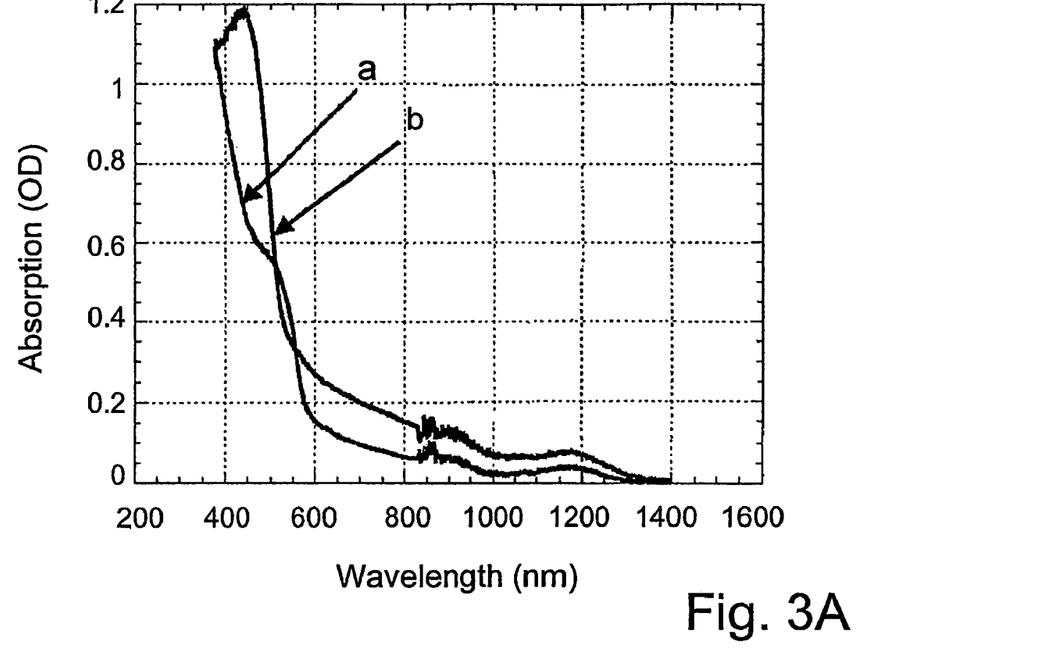
FIG. 3A shows the absorption spectrum of two polymer-nanocrystal composites.

FIG. 3A shows the absorption spectrum, i.e. the curve of optical density (OD) vs. wavelength, of two polymer-nanocrystal composites. In curve a, the polymer is MEH-PPV and, in curve b, the polymer is F6BT. These two spectra demonstrate the reproducibility of the preparation procedure.

Between 1400–600 nm, the absorption spectrum is typical of that of the core/shell nanocrystals themselves as show in FIGS. 2b and 2c. In particular, the first excitonic transition is clearly observed around ~1180 nm. Below 600 nm, the significantly increased absorption due to the polymer is clearly observed. Essentially, the absorption of the nanocrystal/polymer composites is a sum of the absorption spectra of the constituting nanocrystals and polymer film.

Figure 3B:
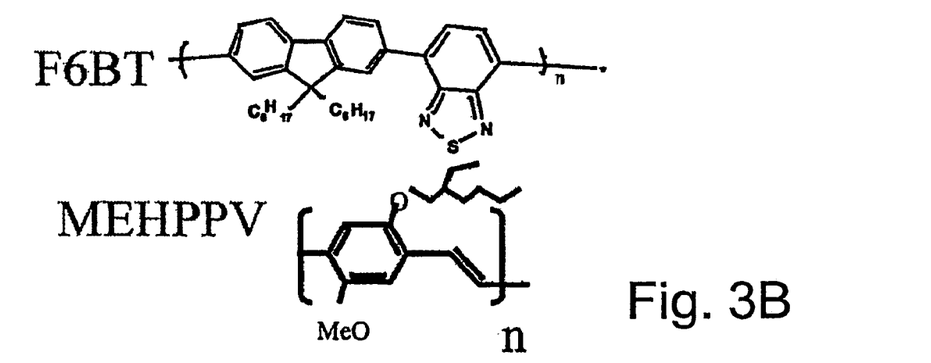
FIG. 3B shows the chemical structure of the MEH-PPV and F6BT polymers.
Figure 3C:
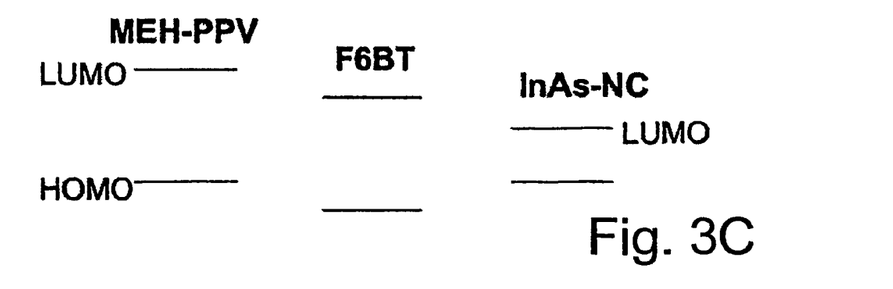
FIG. 3C shows the relative position of the energy levels in the InAs nanocrystal and the polymer-nanocrystal composites.

FIG. 3B shows the chemical structure of the MEH-PPV and F6BT polymers; and FIG. 3C shows the relative position of the energy levels in the InAs nanocrystal and the polymer-nanocrystal composites. The polymers levels were measured using the cyclic voltammetry method and the nano-crystal levels were estimated from their bulk values.

Figure 4:
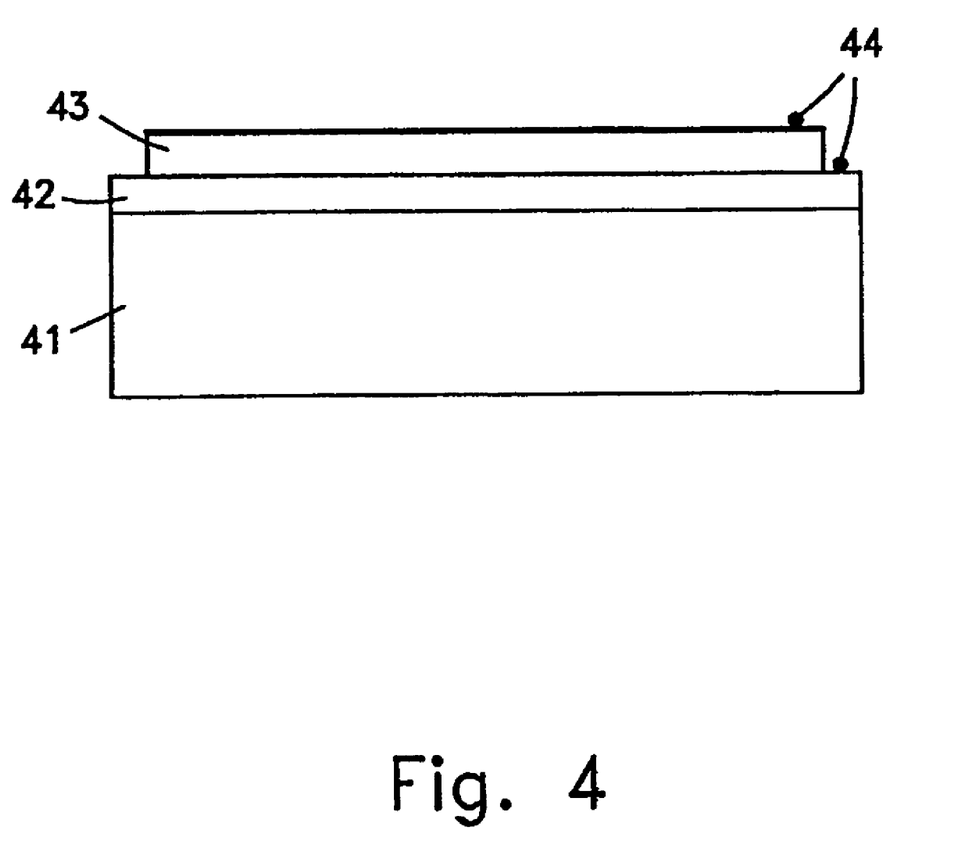
FIG. 4 shows the simple single layer structure used for the light emitting diodes and for the photodetector of the invention.

FIG. 4 shows the simple single layer structure used for the light emitting diodes of the invention. First a substrate of tin doped Indium Oxide (ITO-Glass) {numeral 41} is covered by a layer of PEDOT {numeral 42} and annealed at between 90° C. to 120° C., preferably 110° C., for between 10 to 60 minutes. PEDOT is a transparent, conducting polymer film commercially available from Bayer under the trade name BAYTRON. After cooling of the ITO/PEDOT layer, the nano-composite solution, prepared as described hereinabove, is spin coated on the ITO-PEDOT substrate with a resulting thickness of between 50 nm to 150 nm, typically 100 nm {numeral 43}.

The resulting structure is then annealed at 90° C. (which is preferably above the guest glass transition temperature-Tg) for 30 minutes. Finally Ca/Al contacts {numeral 44} are evaporated at working pressure within the low $10^{-7}$ mbar range. Other alternatives for use in the electrodes are suitable electron injecting materials such as potassium, lithium, sodium or alloys of the above. All stages in the manufacture of the light emitting diode (making the solutions, spinning, annealing, and evaporating) are preferably carried out in an inert glove box with less then 1 ppm of oxygen and water and without exposing the samples to air.

In other embodiments, devices can be constructed by forming multi-layer structures and layers of the same or different type, size, or concentration of nanocrystals can be spin cast on the surface of one or more layers of conducting or semiconducting polymer.

Figure 5:
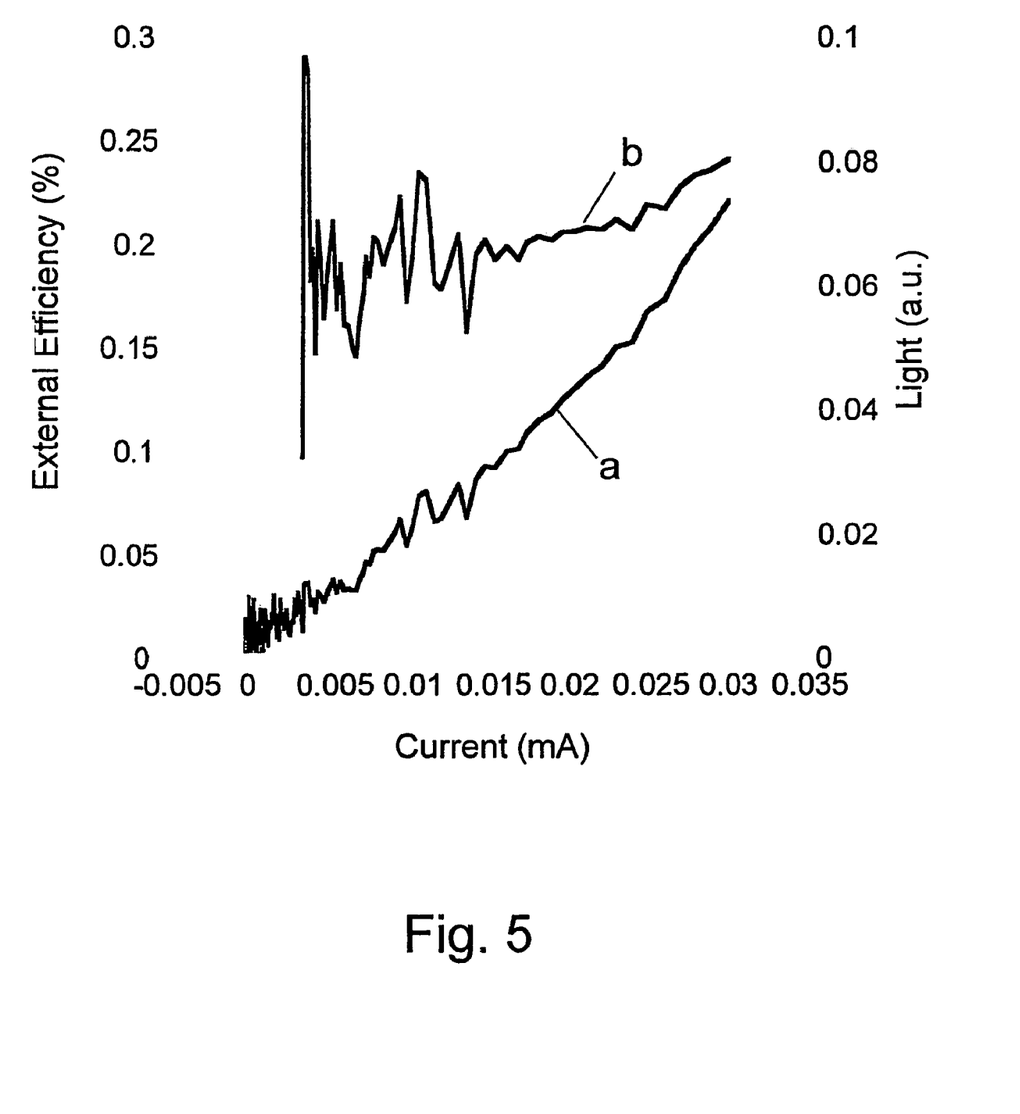
FIG. 5 shows the light intensity and external efficiency curves as a function of the current flowing through a typical LED device of the invention.

FIG. 5 shows the light intensity (line a, measured in arbitrary units) and external efficiency (line b) curves as a function of the current flowing through a typical LED device of the invention.

The curves of FIG. 5 were measured inside a glove box using a Hewlett-Packard semiconductor parameter analyzer and a suitable NIR photo-detector. To ensure measurements of IR emission only, two filters were placed in front of the detector (an OD-5 long pass filter cutting at 1060 nm and a band pass filter transmitting at 1300–1350 nm). The current and light had a simultaneous turn on at about 2V, which is typical of MEH-PPV based polymer LEDs.

The maximum external efficiency was measured to be ~0.3%. Taking into account the possible role of the device structure in directing the light output [25] the internal efficiency is estimated to be in the 0.6–1.2% range.

Figure 6:
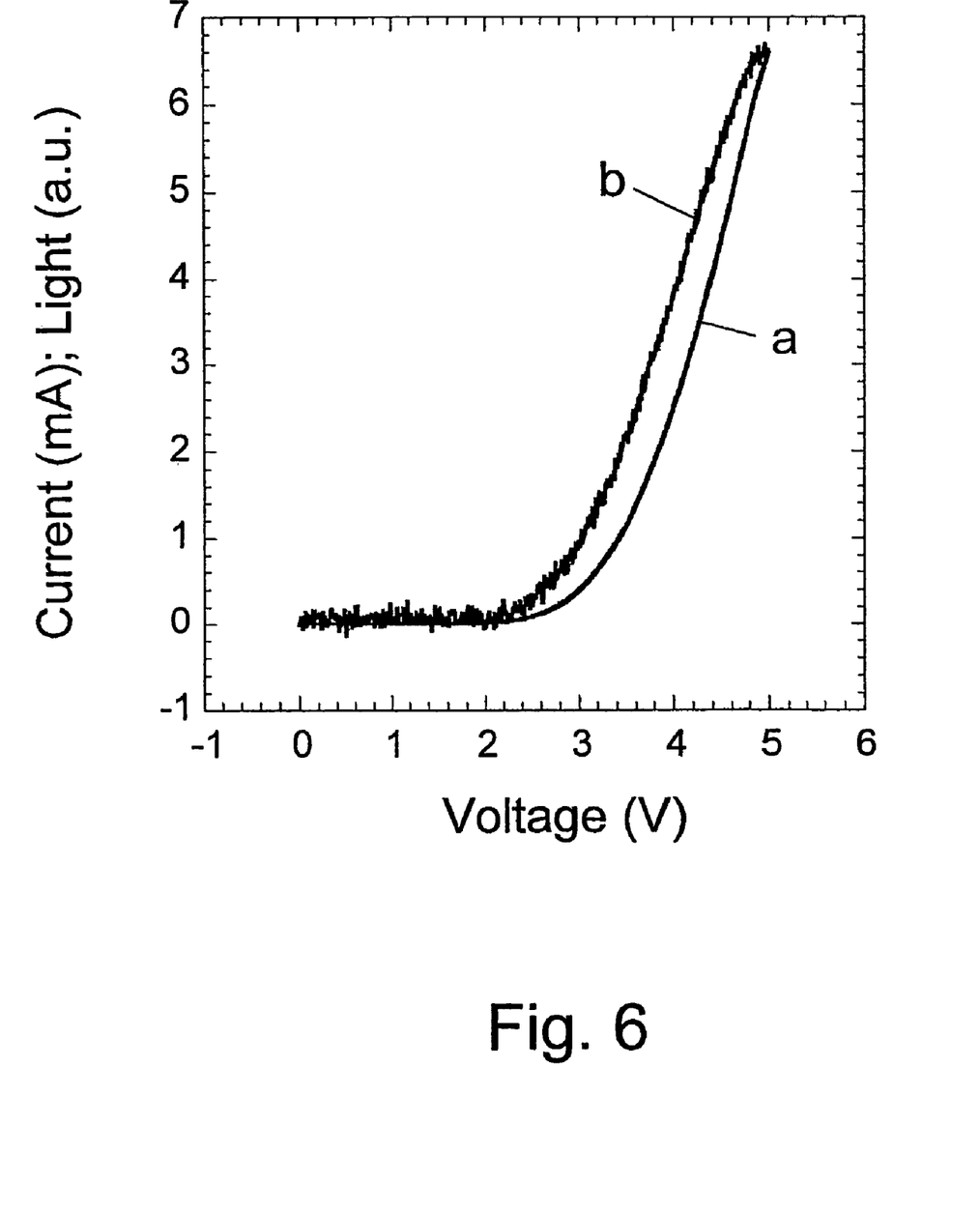
FIG. 6 shows the current and the light response as functions of the applied voltage of a MEH-PPV nanocrystal composite based LED.

FIG. 6 shows the current (line a, measured in mA) and the light response (line b, measured in arbitrary units) as functions of the applied voltage (measured in volts) of a MEH-PPV nanocrystal composite based LED. The composite material has a thickness of about 70 nm.

Figure 7:
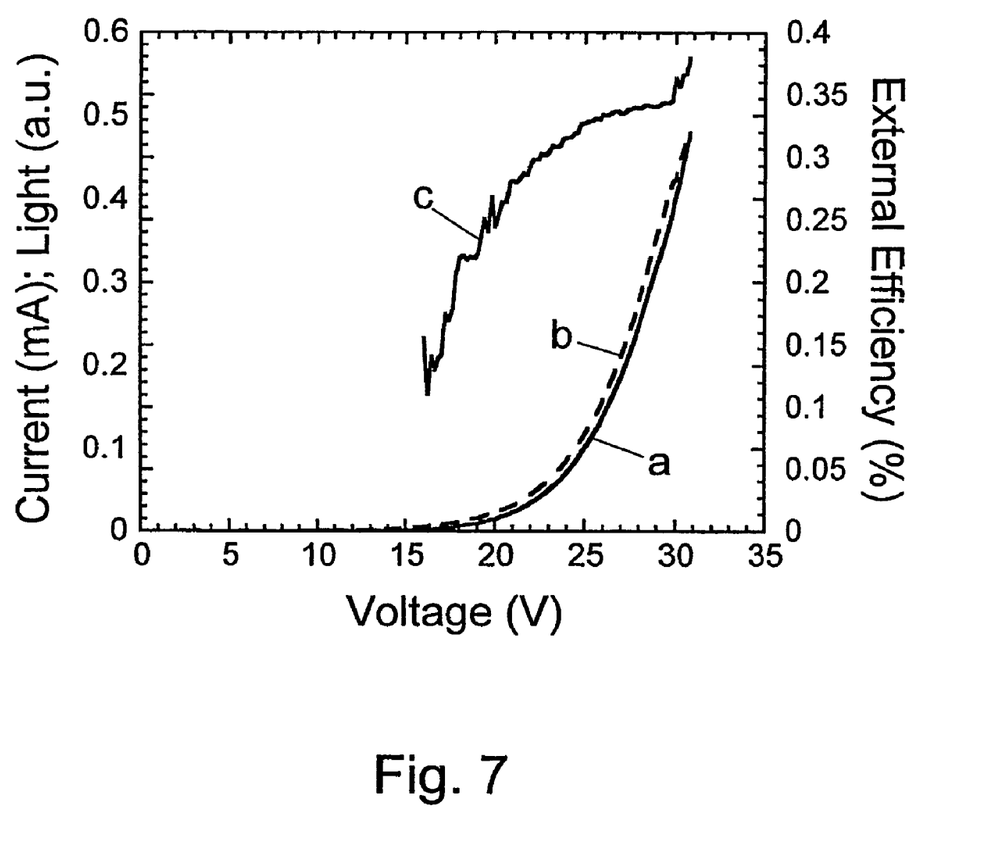
FIG. 7 shows the current, the light response, and the external efficiency as functions of the applied voltage for a composite MEH-PPV nanocrystal material in an LED structure.

FIG. 7 shows typical results for a composite MEH-PPV nanocrystal material that has a thickness of about 120 nm in an LED structure. The current (line a, measured in mA), the light response (line b, measured in arbitrary units), and the external efficiency (line c, measured as %) are shown as functions of the applied voltage (measured in volts). Comparing the results of FIG. 7 to those of FIG. 5, it can be seen that both the turn on voltage and the external efficiency have gone up. Using the composite material of the invention external efficiencies between 0.4% and 1% have been measured.

Figure 8:
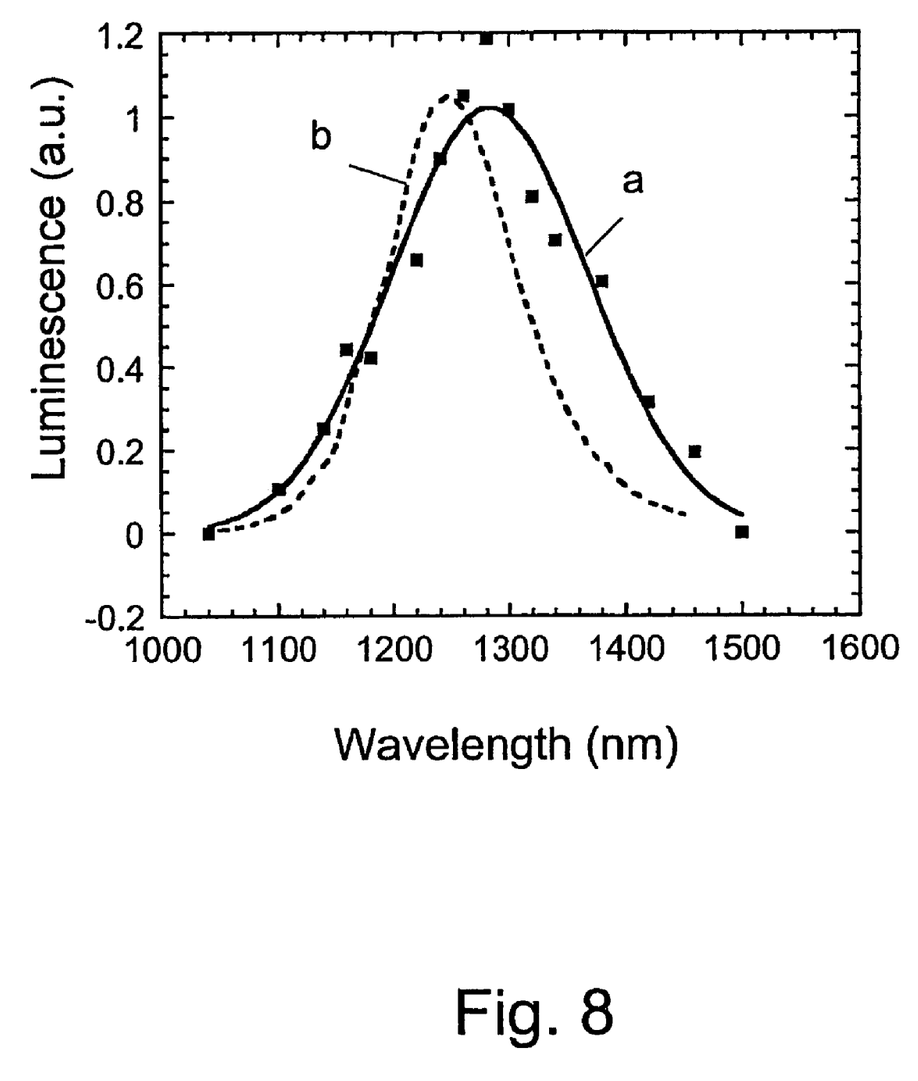
FIG. 8 shows the electroluminescence spectrum as a function of wavelength for a MEH-PPV nanocrystal composite LED.

FIG. 8 shows the electroluminescence spectrum (measured in arbitrary units, squares and line a) as a function of wavelength in nm. The curve is for a MEHPPV nanocrystal composite LED. The spectrum was measured using a set of 20 nm band-pass filters. The photoluminescence spectrum (line b) of the nanocrystals in toluene solution is shown for comparison.

In another embodiment of the invention, a layer of composite material formed from MEH-PPV polymer and InAs nanocrystals were deposited by spin casting on an ITO substrate, and on top a Ca/Al electrode was evaporated to form a near infrared detector. The structure of this detector is similar to that of the LED shown in FIG. 4. In the particular case of the photodetector described herein, the ITO substrate was not coated, however it could optionally be covered by a layer of PEDOT or other suitable material as described hereinabove for the LED.

Nano-composites of conjugated polymer (MEH-PPV [22]) and core nanocrystals were made by first creating separate solutions in toluene, one containing 510 mg/ml of the polymer and another containing 5–100 mg/ml of the nano-particle. Appropriate volumes are then mixed to create the required weight ratio of 1:10 to 1:1, preferably 1:8, (polymer/nanocrystal). Films were spin cast from solution to about 100 nm thickness and the absorption spectra of the composite was measured using UV-VIS spectrometer as a final monitor of the composite ratio.

In this device, it is preferable that the nanocrystals do not have a shell in order to facilitate the charge separation and luminescence quenching needed for photodetectors. Moreover, and unlike in the LED device, phase separation leading to formation of the known interpenetrating networks [26] is preferable. To this extent the organic ligands are partially (~50%) washed off the nano-crystals to promote segregation.

Figure 9:
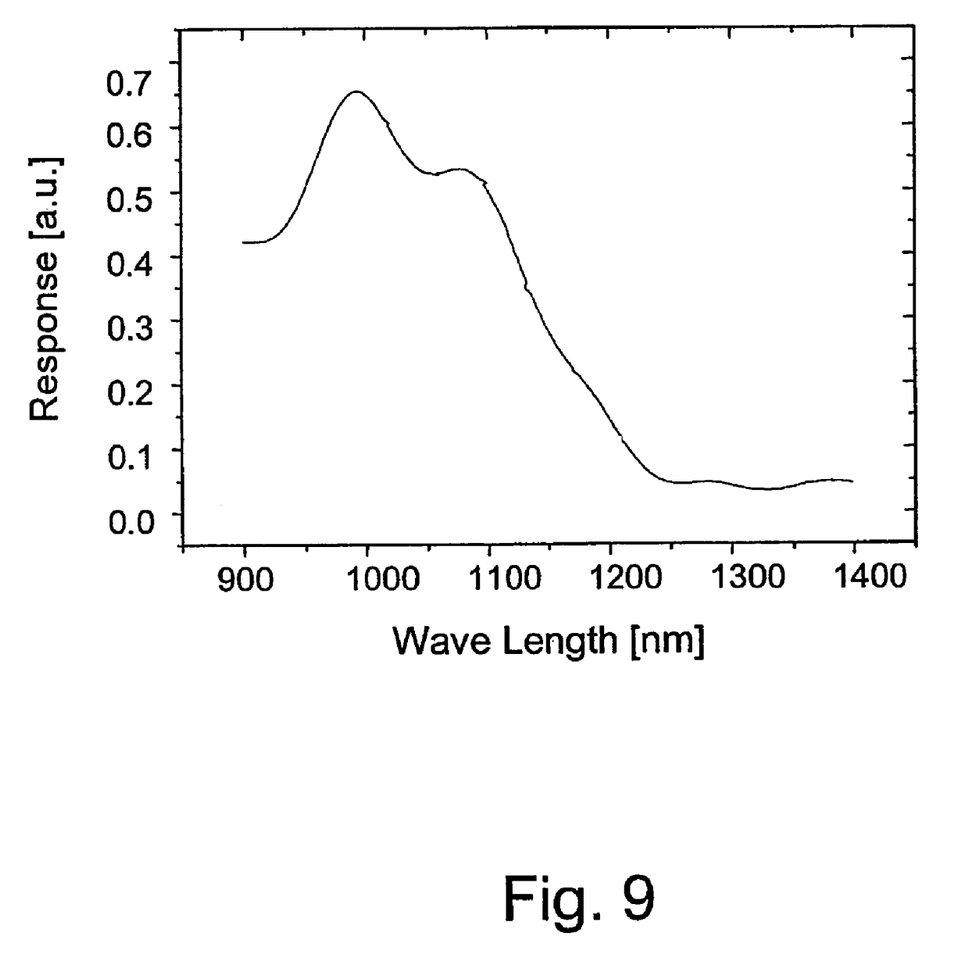
FIG. 9 shows the current response as a function of wavelength for a nanocrystal composite photodetector.

FIG. 9 shows the current response of the detector (in arbitrary units) as a function of wave length. From the curve in the figure it can be seen that the photodetector described above has an onset response at about 1200 nm, as governed by the absorption onset of the particular nanocrystals used in this example. By changing the size of the nanocrystals it is possible to control the onset of the response. In particular, the response can be extended further to the red by use of larger nanocrystals, thus covering the telecommunication bands at 1.3 µm and at 1.5 µm.

Although embodiments of the invention have been described by way of illustration in order to demonstrate a method of producing solution-processable efficient optical devices in the NIR (telecommunication) wavelength range, it will be understood that the invention may be carried out with many variations, modifications, and adaptations, without departing from its spirit or exceeding the scope of the claims. For example:

Optimization of the LED optical and electrical structure can enhance both internal and external efficiency values.

The compatibility of the nano-composite constituents can be further improved by choosing other polymers, different coreshell design, or by adding other elements to create cascade energy transfer from the host to the nano-composite layer.

By preparing a device with multiple layers of conducting or semiconducting polymers, on the surfaces of which layers of nanocrystals can be spin-cast.

By changing the nano-crystal chemical constituents with suitable control of the core and shell material and size, the emission range of the LEDs can be extended to 1.5 µm and beyond.

BIBLIOGRAPHY

[1] A. Dodabalapur, Z. Bao, A. Makhija, J. Laquindanum, V. Raju, Y. Feng, H. Katz, and J. Rogers, "Organic smart pixels," Appl Phys. Lett, vol. 73, pp. 142144, 1998.

[2] Y. Cao, I. D. Parker, G. Yu, C. Zhang, and A. J. Heeger, "Improved quantum efficiency for electroluminescence in semiconducting polymers," Nature, vol. 397, pp. 414–417, 1999.

[3] P. K. H. Ho, D. S. Thomas, R. H. Friend, and N. Tessler, "All-polymer optoelectronic devices," Science, vol. 285, pp. 233–236, 1999.

[4] Y. W. Cao and U. Banin, "Growth and Properties of Semiconductor Core/Shell Nanocrystals with InAs Cores," J. Am. Chem. Soc., vol. 122, pp. 9692–9702, 2000.

[5] R. J. Curry and W. P. Gillin, "1.54 mm electroluminescence from erbium III) tris-8-hydroxyquinoline (ErQ) based organic light-emitting diodes," Appl. Phys. Lett., vol. 75, pp. 1380–1382, 1999.

[6] L. Slooff, A. Polman, F. Cacialli, R. Friend, G. Hebbink, F. van Veggel, and D. Reinhoudt, "Near-infrared electroluminescence of polymer light-emitting diodes doped with a lissamine-sensitized Nd3+ complex," Appl Phys. Lett., vol. 78, pp. 2122–2124, 2001.

[7] Y. Kawamura, Y. Wada, M. Iwamuro, T. Kitamura, and S. Yanagida, "Near-infrared electroluminescence from ytterbium(iii) complex," Chem. Lett., pp. 280–281, 2000.

[8] L. H. Slooff, A. Polman, M. P. Oude Wolbers, F. C. J. M. van Veggel, D. N. Reinhoudt, and J. W. Hofstraat, "Optical properties of erbium-doped organic polydentate cage complexes," J. Appl. Phys., vol. 83, pp. 497–503, 1998.

[9] M. A. Baldo, M. E. Thompson, and S. R. Forrest, "High-efficiency fluorescent organic light-emitting devices using a phosphorescent sensitizer," Nature, vol. 403, pp. 750–753, 2000.

[10] P. K. H. Ho, J. S. Kim, J. H. Burroughes, H. Becker, S. F. Y. Li, T. M. Brown, F. Cacialli, and R. H. Friend, "Molecular-scale interface engineering for polymer light-emitting diodes," Nature, vol. 404, pp. 481–484, 2000.

[11] V. L. Colvin, M. C. Schlamp, and A. P. Alivisatos, "Light-Emitting-Dlodes Made from Cadmium Selenide Nanocrystals and A Semiconducting-Polymer," Nature, vol. 370, pp. 354–357, 1994.

[12] B. O. Dabbousi, M. G. Bawendi, O. Onitsuka, and M. F. Rubner, "Electroluminescence from CdSe Quantum-Dot Polymer Composites," Appl. Phys. Lett., vol. 66, pp. 1316–1318, 1995.

[13] M. C. Schlamp, X. G. Peng, and A. P. Alivisatos, "Improved efficiencies in light emitting diodes made with CdSe(CdS) core/shell type nanocrystals and a semiconducting polymer," J. Appl. Phys., vol. 82, pp. 5837–5842, 1997.

[14] H. Mattoussi, L. H. Radzilowski, B. O. Dabbousi, E. L. Thomas, M. G. Bawendi, and M. F. Rubner, "Electroluminescence from heterostructures of poly(phenylene vinylene) and inorganic CdSe nanocrystals," J Appl. Phys., vol. 83, pp. 7965–7974, 1998.

[15] A. Mews, A. Eychmuller, M. Giersig, D. Schooss, and H. Weller, "Preparation, Characterization, and Photophysics of The Quantum-Dot Quantum-Well System-CdS/HgS/CdS," J. Phys. Chem., vol. 98, pp. 934–941, 1994.

[16] X. G. Peng, M. C. Schlamp, A. V. Kadavanich, and A. P. Alivisatos, "Epitaxial growth of highly luminescent CdSe/CdS core/shell nanocrystals with photostability and electronic accessibility," J. Am. Chem. Soc., vol. 119, pp. 70197029,1997.

[17] B. O. Dabbousi, J. RodriguezViejo, F. V. Mikulec, J. R. Heine, H. Mattoussi, R. Ober, K. F. Jensen, and M. G. Bawendi, "(CdSe)ZnS core-shell quantum dots: Synthesis and characterization of a size series of highly luminescent nanocrystallites," J Phys. Chem. B, vol. 101, pp. 9463–9475, 1997.

[18] S. V. Kershaw, M. Burt, M. Harrison, A. Rogach, H. Weller, and A. Eychmuller, "Colloidal CdTe/HgTe quantum dots with high photoluminescence quantum efficiency at room temperature," Appl. Phys. Lett., vol. 75, pp. 16941696, 1999.

[19] M. T. Harrison, S. V. Kershaw, A. L. Rogach, A. Kornowski, A. Eychmuller, and H. Weller, "Wet chemical synthesis of highly luminescent HgTe/CdS core/shell nanocrystals," Adv. Mat., vol. 12, pp. 123–125, 2000.

[20] Y. W. Cao and U. Banin, "Synthesis and Characterization of InAs/InP and InAs/CdSe Core/Shell Nanocrystals," Angew.Chem. Int. Ed. En,]., vol. 38, pp. 3692–3694, 1999.

[21] V. Cleave, G. Yahioglu, P. LeBarny, R. H. Friend, and N. Tessler, "Harvesting singlet and triplet energy in polymer LEDs," Advanced Materials, vol. 11, pp. 285–288, 1999.

[22] ADSDYES, http•//www.adsdyes.com/, American Dye Source Inc.

[23] A. A. Guzelian, U. Banin, A. V. Kadavanich, X. Peng, and A. P. Alivisatos, "Colloidal chemical synthesis and characterization of InAs nanocrystal quantum dots," Appl. Phys. Lett., vol. 69, pp. 1432–1434, 1996.

[24] X. G. Peng, J. Wickham, and A. P. Alivisatos, "Kinetics of II–VI and III–V colloidal semiconductor nanocrystal growth: "Focusing" of size distributions," J Am. Chem. Soc., vol. 120, pp. 5343–5344, 1998.

[25] N. Tessler, "Transport and optical modeling of organic light-emitting diodes," Appl. Phys. Lett., vol. 77, pp. 1897–1899, 2000.

[26] N. C. Greenham, X. G. Peng, and A. P. Alivisatos, "Charge separation and transport in conjugated-polymer/semiconductor-nanocrystal composites studied by photoluminescence quenching and photoconductivity," Phys. Rev. B—Cond. Matt., vol. 54, pp. 17628–17637, 1996.

The invention claimed is:

1. A composite material comprising a host material in which is incorporated semiconductor nanocrystals, wherein:
said host material is light-transmissive or light-emissive or both light-transmissive and light-emissive and is electrical charge-transporting such as to permit electrical charge transport through said host to the core of said nanocrystals; and
said nanocrystals comprise a semiconductor nanocrystal core that emits and absorbs energy in the near infra red (NIR), and comprise at least one crystalline shell layer encapsulating said core, said shell causing said semiconductor nanocrystals to have values of quantum yield and chemical stability and photostability that are changed from the values of an identical non-encapsulated nanocore, wherein said nanocrystal has removable or substitutable organic ligands on the outer surface thereof characterized in that materials and thickness of said crystalline shell and/or said organic ligands are chosen so as to decouple the energies of said core and said host material at the near infrared (NIR) sufficiently to avoid quenching of the emission of energy by said core through interaction with said host thereby at least partially shielding said core from the absorption resonances of said host material and allowing said cores of said nanocrystals to emit light by electroluminescence in the near infrared spectral range when an electrical potential exists in or an electrical current flows through said composite material and allowing an electrical current to flow in said composite material when light in the near infrared range is absorbed by said cores of nanocrystals.

2. A composite material according to claim 1 wherein the nanocrystals are comprised of one single crystalline shell layer.

3. A composite material according to claim 1 wherein the semiconductor core consists of any one of PbSe, PbS, InAs, and InSb.

4. A composite material according to claim 1 wherein the core is a complex nanocrystalline core comprising a first cation species and a first anion species and at least one additional ionic species which may be cationic or anionic, the ratio of total cationic species to total anionic species being substantially equimolar.

5. A composite material according to claim 4, wherein the cationic species is/are selected from In, Ga, or Al and the anionic species is/are selected from As, Sb and P.

6. A composite material according to claim 4, wherein the core further comprises at least one additional species at dopant concentration.

7. A composite material according to claim 6, wherein the additional species is a rare-earth element.

8. A composite material according to claim 1, wherein the shell comprises a first cationic species and a first anionic species at a substantially equimolar ratio.

9. A composite material according to claim 8, wherein the first cationic species is selected from Zn and Cd and the first anionic species is selected from sulphur. Te, and Se.

10. A composite material according to claim 8, wherein the first cationic species is Ga and the first anionic species is selected from As and P.

11. A composite material according to claim 10, wherein the shell further comprises additional species at dopant concentrations.

12. A composite material according to claim 1, wherein the shell is a complex nanocrystalline shell that comprises a first cationic species and a first anionic species and at least one additional ionic species, which may be cationic or anionic, the ratio of total cationic species to total anionic species being substantially equimolar.

13. A composite material according to claim 12, wherein the additional cationic species are selected from Zn, Cd, Ga, Al and In and the additional anionic species are selected from sulphur, Se, As, and P.

14. A composite material according to claim 12, wherein the shell further comprises additional species at dopant concentrations.

15. A composite material according to claim 1, wherein the organic ligand on the outer surface of the nanocrystal is selected from the group consisting of:
phosphines;
amines; and
thiols.

16. A composite material according to claim 1, wherein the host material is an organic material, selected from the group consisting of:
polymers and conjugated polymers;
oligomers; and
materials composed of small organic molecules.

17. A composite material according to claim 1, wherein the host material is a polymer selected from the group consisting of:
poly(p-phenylenevinylene)(PPV);
poly(2-methoxy-5-(2'-ethyl)hexyloxyphenylene-vinylene), also referred to as (MEH-PPV, commercially available as ADS-100RE);
a PPV-derivative (e.g. a di-alkoxy or di-alkyl derivative);
polyfluorene and/or a co-polymer incorporating polyfluorene segments;
PPVs and/or related co-polymers;
F6BT(ADS133);
PFOBT;
A side chain polymer such as PNP;
A doped polymer such as PEDOT or PANI; and
any other doped matrix such that the doping concentration is kept to the minimum required for efficient conduction in the presence of the nanocrystals.

18. A composite material according to claim 1, wherein the host material is Alq3.

19. A composite material according to claim 1, wherein the emission/absorption has a wavelength of from about 0.8 microns to about 2 microns.

20. An electro-optical device comprising the composite material of claim 1.

21. An electro-optical device according to claim 20, wherein said device is chosen from the group composed of
light emitting diodes (LEDs);
lasers;
photovoltaic cells;
photo-transistors;
transistors;
detectors; and
modulators.

22. An electro-optical device according to claim 20, comprising a layer or number of layers of a conducting and/or semiconducting polymers, which are deposited on a conductive substrate, a layer of semiconductor nanocrystals, which is deposited within or on the surface or at least one of said layers, and metallic contacts evaporated on one or more of the layers to provide electrical contact to said device; wherein said composite material has a modified dielectric constant, compared to the host material, and/or emits/absorbs energy in the near infrared spectral range and wherein said host material permits electrical charge transport to the core of said nanocrystals.

23. An electro-optical device according to claim 20, wherein said electro optical device is a light emitting diode, the host material is light-transmissive, and the semiconductor nanocrystals efficiently change emit energy in the near infrared spectral range when an electric potential is applied to said diode.

24. An electro-optical device according to claim 23, wherein the energy is emitted in the range 0.8 μm to 2 μm.

25. An electro-optical device according to claim 23 wherein the weight ratio between the nanocrystals and the suitable host material is between 1:10 to 1:1 (host/nanocrystal).

26. A method of producing the electro-optical device of claim 23 comprising the following steps:
   coating the substrate with a material;
   annealing the coated substrate;
   cooling the annealed substrate;
   spin-coating a nano-composite solution on the surface of the coated substrate;
   annealing the resulting structure; and
   evaporating electrical contacts at the appropriate places on said resulting structure.

27. A method according to claim 26, wherein the substrate is ITO-Glass.

28. A method according to claim 26, wherein the material coating the substrate is PEDOT.

29. A method according to claim 26, wherein the nano-composite solution is spin-coated on the surface of the coated substrate to a resulting thickness of 50 nm to 150 nm.

30. A method according to claim 26, wherein the electrical contacts consist of electron ejecting materials.

31. A method according to claim 30, wherein the electron ejecting materials are chosen from the group consisting of Ca, Al, K, Li, Na, and any alloy thereof.

32. An electro-optical device according to claim 21, wherein said electro optical device is a photo-detector, the host material is light-transmissive, and the semiconductor nanocrystals efficiently absorb energy in the near infrared spectral range when infrared energy impinges upon said photo-detector.

33. An electro-optical device according to claim 32, wherein the energy is absorbed with an onset in the range 0.8 μm to 1.7 μm.

34. An electro-optical device according to claim 32, wherein the weight ratio between the nanocrystals and the suitable host material is 1:10 to 1:1 (host/nanocrystal).

35. A method of producing the electro-optical device of claim 32, consisting of the following steps:
   selecting a substrate;
   spin-coating a nano-composite solution on the surface of the substrate;
   annealing the resulting structure; and
   evaporating electrical contacts at the appropriate places on said resulting structure.

36. A method according to claim 35 further comprising the following steps carried out before the step of spin-coating:
   a. coating the substrate with a material;
   b. annealing the coated substrate; and
   c. cooling the annealed coated substrate.

37. A method according to claim 36, wherein the material coating the substrate is PEDOT.

38. A method according to claim 35, wherein the substrate is ITO-Glass.

39. A method according to claim 35, wherein the nano-composite solution is spin-coated on the surface of the coated substrate to a resulting thickness of 50 nm to 150 nm.

40. A method according to claim 35, wherein the electrical contacts consist of electron ejecting materials.

41. A method according to claim 40, wherein the electron ejecting materials are chosen from the group consisting of Ca, Al, K., Li, Na, and any alloy thereof.

42. A composite material according to claim 1, wherein the nanocrystals are comprised of multiple crystalline shell layers.

* * * * *

UNITED STATES PATENT AND TRADEMARK OFFICE
CERTIFICATE OF CORRECTION

PATENT NO. : 7,200,318 B2
APPLICATION NO. : 10/837095
DATED : April 3, 2007
INVENTOR(S) : Uri Banin et al.

Page 1 of 1

It is certified that error appears in the above-identified patent and that said Letters Patent is hereby corrected as shown below:

Col. 13, line 44 (Claim 9)   change "sulphur." to --sulphur,--.

Signed and Sealed this

Nineteenth Day of June, 2007

JON W. DUDAS
*Director of the United States Patent and Trademark Office*